US007611758B2

(12) United States Patent
Fukiage et al.

(10) Patent No.: US 7,611,758 B2
(45) Date of Patent: Nov. 3, 2009

(54) METHOD OF IMPROVING POST-DEVELOP PHOTORESIST PROFILE ON A DEPOSITED DIELECTRIC FILM

(75) Inventors: Noriaki Fukiage, Hartsdale, NY (US); Katherina Babich, Chappaqua, NY (US)

(73) Assignees: Tokyo Electron Limited, Tokyo (JP); International Business Machines Corporation, Armonk, NY (US)

( * ) Notice: Subject to any disclaimer, the term of this patent is extended or adjusted under 35 U.S.C. 154(b) by 934 days.

(21) Appl. No.: 10/702,049

(22) Filed: Nov. 6, 2003

(65) Prior Publication Data
US 2005/0100683 A1    May 12, 2005

(51) Int. Cl.
*H05H 1/24*    (2006.01)
(52) U.S. Cl. ..................................... 427/569
(58) Field of Classification Search ................. 430/313, 430/272.1, 311; 427/282, 353
See application file for complete search history.

(56) References Cited

U.S. PATENT DOCUMENTS

| | | | | |
|---|---|---|---|---|
| 4,951,601 | A * | 8/1990 | Maydan et al. | 118/719 |
| 5,776,834 | A * | 7/1998 | Avanzino et al. | 438/692 |
| 5,883,001 | A * | 3/1999 | Jin et al. | 438/624 |
| 6,074,488 | A * | 6/2000 | Roderick et al. | 118/728 |
| 6,108,463 | A * | 8/2000 | Herron et al. | 385/12 |
| 6,238,160 | B1 * | 5/2001 | Hwang et al. | 414/217 |
| 6,287,959 | B1 | 9/2001 | Lyons et al. | |
| 6,316,167 | B1 * | 11/2001 | Angelopoulos et al. | 430/313 |
| 6,380,611 | B1 | 4/2002 | Yin et al. | |
| 6,410,462 | B1 * | 6/2002 | Yang et al. | 438/788 |
| 6,869,750 | B2 * | 3/2005 | Zhang et al. | 430/312 |
| 6,927,161 | B2 * | 8/2005 | Ruelke et al. | 438/637 |
| 2002/0076843 | A1 | 6/2002 | Ruelke et al. | |
| 2002/0106891 | A1 | 8/2002 | Kim et al. | |
| 2002/0163028 | A1 * | 11/2002 | Yuan | 257/303 |
| 2003/0003768 | A1 * | 1/2003 | Cho et al. | 438/778 |
| 2003/0017694 | A1 * | 1/2003 | Nguyen et al. | 438/637 |
| 2003/0044621 | A1 * | 3/2003 | Won et al. | 428/446 |
| 2003/0203652 | A1 | 10/2003 | Bao et al. | |
| 2004/0137169 | A1 * | 7/2004 | Carollo | 427/579 |
| 2004/0147137 | A1 * | 7/2004 | Hiraiwa et al. | 438/778 |

OTHER PUBLICATIONS

A. Grill, Journal of Applied Physics 93(2003)1785-1790.*
A. Grill, Journal of Applied Physics 93(2003)1758-1790.*
Sang-Yun Lee, Journal of Electrochemical Society, 150(1)G58-G61(2003).*
C.H.Lin et al., "A study on adhesion and footing issues of HMDSO films as bottom antireflective coating for deep UV lithographies," Microelectronic Engineering, Elsevier (Netherlands), vol. 57-58, pp. 555-561, (Sep. 2001).
Sang-Yun Lee et al., "Inorganic Si-O-C Antireflection Coating at 193 nm for Cu Dual Damascene Process," Journal of Electrochemical Society USA, vol. 150 ( No. 1), pp. G58-G61, (Jan. 2003).

* cited by examiner

*Primary Examiner*—Michael Cleveland
*Assistant Examiner*—Tabassom Tadayyon Eslami

(57) ABSTRACT

A method and apparatus for improving the post-development photoresist profile on a deposited dielectric film. The method includes depositing a TERA film having tunable optical and etch resistant properties on a substrate using a plasma-enhanced chemical vapor deposition process and post processing the TERA film using a plasma process. The apparatus includes a chamber having an upper electrode coupled to a first RF source and a substrate holder coupled to a second RF source; and a showerhead for providing multiple precursors and process gasses.

18 Claims, 4 Drawing Sheets

METHOD OF IMPROVING POST-DEVELOP PHOTORESIST PROFILE ON A DEPOSITED DIELECTRIC FILM

CROSS-REFERENCE TO RELATED APPLICATIONS

This application is related to U.S. patent application Ser. No. 10/644,958 now U.S. Pat. No. 7,371,436, entitled "Method and Apparatus For Depositing Materials With Tunable Optical Properties And Etching Characteristics", filed on Aug. 21, 2003; and co-pending U.S. patent application Ser. No. 10/702,048, entitled "Method for Depositing Materials on a Substrate", filed on even date herewith. The entire contents of these applications are herein incorporated by reference in their entirety.

FIELD OF THE INVENTION

The present invention relates to using a plasma-enhanced chemical vapor deposition (PECVD) system to deposit thin-film materials with tunable optical and etching characteristics.

BACKGROUND OF THE INVENTION

Integrated circuit and device fabrication requires deposition of electronic materials on substrates. The deposited film may be a permanent part of the substrate or finished circuit. In this case, the film characteristics are chosen to provide the electrical, physical, or chemical properties required for circuit operation. In other cases, the film may be employed as a temporary layer that enables or simplifies device or circuit fabrication. For example, a deposited film may serve as a mask for subsequent etching processes. The etch-resistant film may be patterned such that it covers areas of the substrate that are not to be removed by the etch process. A subsequent process may then remove the etch-resistant film in order to allow further processing of the substrate.

In another example of a temporary layer, a film may be employed to enhance a subsequent lithographic patterning operation. In one embodiment, a film with specific optical properties is deposited on a substrate, after which the film is coated with a photosensitive imaging film commonly referred to as photoresist. The photoresist is then patterned by exposure to light. The optical properties of the underlying deposited film are chosen to reduce reflection of the exposing light, thereby improving the resolution of the lithographic process. Such a film is commonly referred to as an anti-reflective coating (henceforth: ARC).

In another example of a temporary layer, a film may be employed that acts both as a hard mask and an antireflective coating, such as the film described in U.S. Pat. No. 6,316,167.

SUMMARY OF THE INVENTION

The present invention relates to a deposition process in a PECVD system, and more particularly, to the deposition of a Tunable Etch Resistant ARC (TERA) layer with improved photoresist compatibility. More specifically, the final steps of the deposition process are used to modify TERA layer surface such that residual resist (footing) is reduced and/or eliminated during a subsequent lithographic operation.

DETAILED DESCRIPTION OF AN EMBODIMENT

Figure 1:
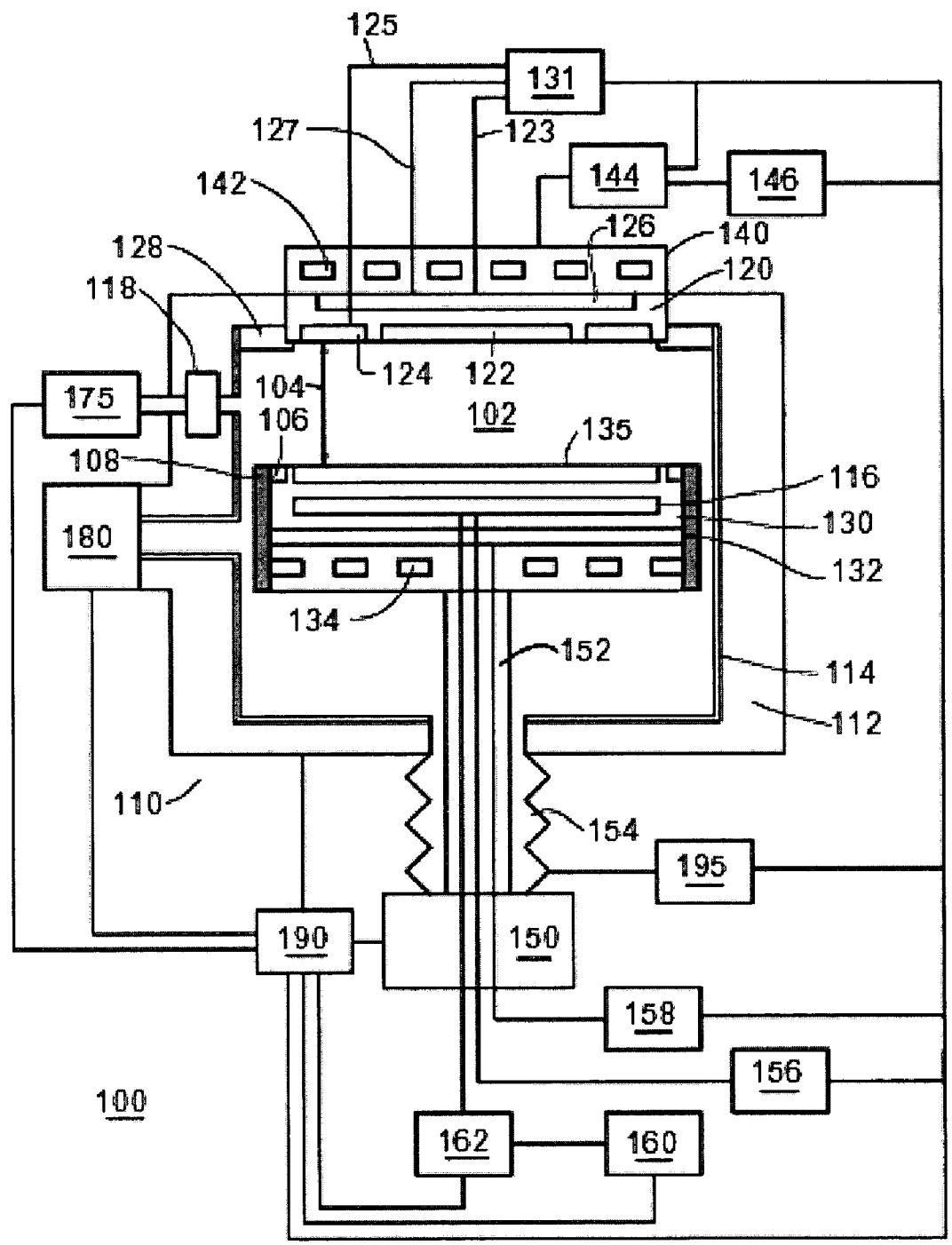
FIG. 1 illustrates a simplified block diagram for a PECVD system in accordance with an embodiment of the present invention.

FIG. 1 illustrates a simplified block diagram for a PECVD system in accordance with an embodiment of the present invention. In the illustrated embodiment, PECVD system 100 comprises processing chamber 110, upper electrode 140 as part of a capacitively coupled plasma source, shower plate assembly 120, substrate holder 130 for supporting substrate 135, pressure control system 180, and controller 190.

In one embodiment, PECVD system 100 can comprise a remote plasma system 175 that can be coupled to the processing chamber 110 using a valve 178. In another embodiment, a remote plasma system and valve are not required. The remote plasma system 175 can be used for chamber cleaning.

In one embodiment, PECVD system 100 can comprise a pressure control system 180 that can be coupled to the processing chamber 110. For example, the pressure control system 180 can comprise a throttle valve (not shown) and a turbomolecular pump (TMP) (not shown) and can provide a controlled pressure in processing chamber 110. In alternate embodiments, the pressure control system can comprise a dry pump. For example, the chamber pressure can range from approximately 0.1 mTorr to approximately 100 Torr. Alternatively, the chamber pressure can range from approximately 0.1 Torr to approximately 20 Torr.

Processing chamber 110 can facilitate the formation of plasma in process space 102. PECVD system 100 can be configured to process substrates of any size, such as 200 mm substrates, 300 mm substrates, or larger substrates. Alternately, the PECVD system 100 can operate by generating plasma in one or more processing chambers.

PECVD system 100 comprises a shower plate assembly 120 coupled to the processing chamber 110. Shower plate assembly is mounted opposite the substrate holder 130. Shower plate assembly 120 comprises a center region 122, an edge region 124, and a sub region 126. Shield ring 128 can be used to couple shower plate assembly 120 to processing chamber 110.

Center region 122 is coupled to gas supply system 131 by a first process gas line 123. Edge region 124 is coupled to gas supply system 131 by a second process gas line 125. Sub region 126 is coupled to gas supply system 131 by a third process gas line 127.

Gas supply system 131 provides a first process gas to the center region 122, a second process gas to the edge region 124, and a third process gas to the sub region 126. The gas chemistries and flow rates can be individually controlled to these regions. Alternately, the center region and the edge region can be coupled together as a single primary region, and gas supply system can provide the first process gas and/or the second process gas to the primary region. In alternate embodiments, any of the regions can be coupled together and the gas supply system can provide one or more process gasses as appropriate.

The gas supply system 131 can comprise at least one vaporizer (not shown) for providing precursors. Alternately, a vaporizer is not required. In an alternate embodiment, a bubbling system can be used.

PECVD system 100 comprises an upper electrode 140 that can be coupled to shower plate assembly 120 and coupled to the processing chamber 110. Upper electrode 140 can comprise temperature control elements 142. Upper electrode 140 can be coupled to a first RF source 146 using a first match network 144. Alternately, a separate match network is not required.

The first RF source 146 provides a TRF signal to the upper electrode, and the first RF source 146 can operate in a frequency range from approximately 0.1 MHz. to approximately 200 MHz. The TRF signal can be in the frequency range from approximately 1 MHz. to approximately 100 MHz, or alternatively in the frequency range from approximately 2 MHz. to approximately 60 MHz. The first RF source can operate in a power range from approximately 0 watts to approximately 10000 watts, or alternatively the first RF source operates in a power range from approximately 0 watts to approximately 5000 watts.

Upper electrode 140 and RF source 146 are parts of a capacitively coupled plasma source. The capacitively couple plasma source may be replaced with or augmented by other types of plasma sources, such as an inductively coupled plasma (ICP) source, a transformer-coupled plasma (TCP) source, a microwave powered plasma source, an electron cyclotron resonance (ECR) plasma source, a Helicon wave plasma source, and a surface wave plasma source. As is well known in the art, upper electrode 140 may be eliminated or reconfigured in the various suitable plasma sources.

Substrate 135 can be, for example, transferred into and out of processing chamber 110 through a slot valve (not shown) and chamber feed-through (not shown) via robotic substrate transfer system (not shown), and it can be received by substrate holder 130 and mechanically translated by devices coupled thereto. Once substrate 135 is received from substrate transfer system, substrate 135 can be raised and/or lowered using a translation device 150 that can be coupled to substrate holder 130 by a coupling assembly 152.

Substrate 135 can be affixed to the substrate holder 130 via an electrostatic clamping system. For example, an electrostatic clamping system can comprise an electrode 117 and an ESC supply 156. Clamping voltages, that can range from approximately −2000 V to approximately +2000 V, for example, can be provided to the clamping electrode. Alternatively, the clamping voltage can range from approximately −1000 V to approximately +1000 V. In alternate embodiments, an ESC system and supply is not required.

Substrate holder 130 can comprise lift pins (not shown) for lowering and/or raising a substrate to and/or from the surface of the substrate holder. In alternate embodiments, different lifting means can be provided in substrate holder 130. In alternate embodiments, gas can, for example, be delivered to the backside of substrate 135 via a backside gas system to improve the gas-gap thermal conductance between substrate 135 and substrate holder 130.

A temperature control system can also be provided. Such a system can be utilized when temperature control of the substrate is required at elevated or reduced temperatures. For example, a heating element 132, such as resistive heating elements, or thermoelectric heaters/coolers can be included, and substrate holder 130 can further include a heat exchange system 134. Heating element 132 can be coupled to heater supply 158. Heat exchange system 134 can include a re-circulating coolant flow means that receives heat from substrate holder 130 and transfers heat to a heat exchanger system (not shown), or when heating, transfers heat from the heat exchanger system.

Also, electrode 116 can be coupled to a second RF source 160 using a second match network 162. Alternately, a match network is not required.

The second RF source 160 provides a bottom RF signal (BRF) to the lower electrode 116, and the second RF source 160 can operate in a frequency range from approximately 0.1 MHz. to approximately 200 MHz. The BRF signal can be in the frequency range from approximately 0.2 MHz. to approximately 30 MHz, or alternatively, in the frequency range from approximately 0.3 MHz. to approximately 15 MHz. The second RF source can operate in a power range from approximately 0.0 watts to approximately 1000 watts, or alternatively, the second RF source can operate in a power range from approximately 0.0 watts to approximately 500 watts. In various embodiments, the lower electrode 116 may not be used, or may be the sole source of plasma within the chamber, or may augment any additional plasma source.

PECVD system 100 can further comprise a translation device 150 that can be coupled by a bellows 154 to the processing chamber 110. Also, coupling assembly 152 can couple translation device 150 to the substrate holder 130. Bellows 154 is configured to seal the vertical translation device from the atmosphere outside the processing chamber 110.

Translation device 150 allows a variable gap 104 to be established between the shower plate assembly 120 and the substrate 135. The gap can range from approximately 1 mm to approximately 200 mm, and alternatively, the gap can range from approximately 2 mm to approximately 80 mm. The gap can remain fixed or the gap can be changed during a deposition process.

Additionally, substrate holder 130 can further comprise a focus ring 106 and ceramic cover 108. Alternately, a focus ring 106 and/or ceramic cover 108 are not required.

At least one chamber wall 112 can comprise a coating 114 to protect the wall. For example, the coating 114 can comprise a ceramic material. In an alternate embodiment, a coating is not required. Furthermore, a ceramic shield (not shown) can be used within processing chamber 110. In addition, the temperature control system can be used to control the chamber wall temperature. For example, ports can be provided in the chamber wall for controlling temperature. Chamber wall temperature can be maintained relatively constant while a process is being performed in the chamber.

Also, the temperature control system can be used to control the temperature of the upper electrode. Temperature control elements 142 can be used to control the upper electrode temperature. Upper electrode temperature can be maintained relatively constant while a process is being performed in the chamber.

Furthermore, PECVD system 100 can also comprise a purging system 195 that can be used for controlling contamination.

In an alternate embodiment, processing chamber 110 can, for example, further comprise a monitoring port (not shown). A monitoring port can, for example, permit optical monitoring of process space 102.

PECVD system 100 also comprises a controller 190. Controller 190 can be coupled to chamber 110, shower plate assembly 120, substrate holder 130, gas supply system 131, upper electrode 140, first RF match 144, first RF source 146, translation device 150, ESC supply 156, heater supply 158, second RF match 162, second RF source 160, purging system 195, remote plasma device 175, and pressure control system 180. The controller can be configured to provide control data to these components and receive data such as process data from these components. For example, controller 190 can comprise a microprocessor, a memory, and a digital I/O port capable of generating control voltages sufficient to communicate and activate inputs to the processing system 100 as well as monitor outputs from the PECVD system 100. Moreover, the controller 190 can exchange information with system components. Also, a program stored in the memory can be utilized to control the aforementioned components of a PECVD system 100 according to a process recipe. In addition, controller 190 can be configured to analyze the process data, to compare the process data with target process data, and to use the comparison to change a process and/or control the deposition tool. Also, the controller can be configured to analyze the process data, to compare the process data with historical process data, and to use the comparison to predict, prevent, and/or declare a fault.

Figure 2A:
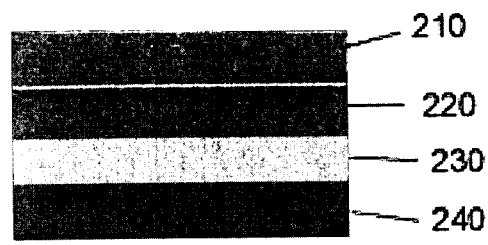
FIGS. 2A-2C show a simplified procedure for preventing the formation of a photoresist footing on a TERA layer in accordance with an embodiment of the present invention.
Figure 2B:
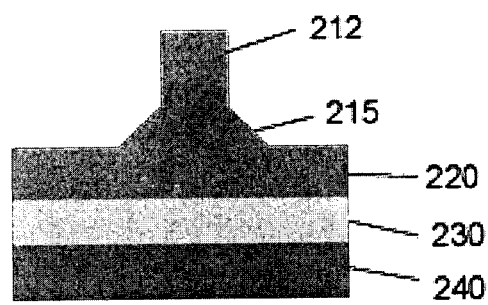
Figure 2C:
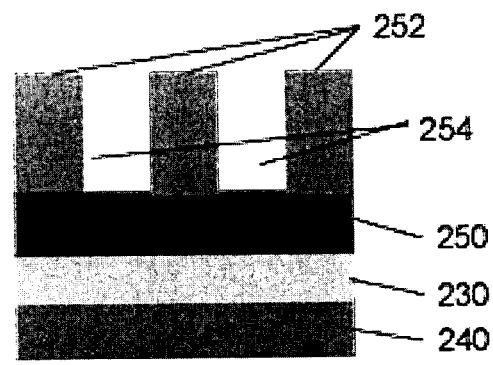

FIGS. 2A-2C show a simplified procedure for preventing the formation of a photoresist footing on a TERA layer in accordance with an embodiment of the present invention. FIG. 2A shows a photoresist layer 210 on a TERA layer, which comprises a top portion 220 and a bottom portion 230. For example, the top portion 220 of the TERA layer be a layer having a thickness of approximately 150 A to approximately 1000 A, and the bottom portion 230 of the TERA layer be a layer having a thickness of approximately 300 A to approximately 5000 A. In this example, the TERA bottom portion 230 is coupled to an oxide layer 240. This is not required, and the TERA layer may be deposited on materials other than oxide. Although two layers are shown in FIGS. 2A-2C, this is not required. A TERA stack can comprise one or more layers.

In FIG. 2B, the photoresist layer 210 has been processed using at least one lithography step and at least one development step. FIG. 2B shows a photoresist feature 212 on a TERA layer, which comprises a top portion 220 and a bottom portion 230. Also, a photoresist footing 215 is shown at the base of the photoresist feature 212. For example, a photoresist footing can be caused by an interaction between the top portion 220 of the TERA layer and the photoresist layer 210. Resist footing can be caused by a reaction between the TERA layer material and the substrate material and/or out-gassing from the substrate. Photoresist footings can cause problems during the subsequent steps in the processing of the substrate and should be prevented from forming.

In FIG. 2C, the photoresist layer 210 has been processed using the method of the present invention. FIG. 2C shows a layer 250 and a well-defined photoresist feature 252 and well-defined openings 254 in the photoresist on the layer 250 of the TERA layer that was deposited using the method of the present invention. As shown in FIG. 2C, the features 252 and the openings 254 can have substantially rectangular shapes, but this is not required. In alternate embodiments, square shaped features and/or openings can be present. In FIG. 2C, the photoresist footings are small or even eliminated.

In this example, the TERA bottom portion 230 is coupled to an oxide layer 240. This is not required, and the TERA layer may be deposited on materials other than oxide. Although three layers (230, 220 and 250) are shown in FIG. 2C, this is not required. A TERA stack can comprise one or more layers. For example, a single layer, such as layer 250, can be used.

The inventors believe that the resist footing can limit the ability of a resist material to accurately image nanostructures on a substrate and the resist footing can also adversely affect the CD measurements. The inventors have developed methods for minimizing and/or eliminating the resist footing.

The inventors also believe that the photoresist footing may be caused by a chemical interaction at the interface between the ARC and photoresist, commonly referred to as resist poisoning. For example, amine-based species present at the top surface of the ARC layer may react with a chemically amplified photoresist and reduce the photoresist development rate near the resist-substrate interface. This may prevent complete resist dissolution during the development step, thereby producing resist footing. The inventors have developed methods to ensure that the top surface of the TERA layer (i.e., the surface in direct contact with the photoresist) does not react with the resist in such a way that it adversely alters the resist development characteristics.

Furthermore, the inventors believe that the photoresist footing may also occur if an excessively strong adhesive bond is formed between the resist and the arc layer. It is generally desirable to have good adhesion between the resist and underlying layer to insure that the resist does not delaminate from the substrate during subsequent processing. However, if the adhesive bond is too strong, the exposed resist may not be fully removed during the development step. Residual resist maybe present in the exposed regions, particularly in the area adjacent to the unexposed pattern, and the resulting resist profile may exhibit footing. The inventors have developed methods for producing a TERA layer having a top surface that exhibits appropriate adhesive properties with respect to the photoresist. In this case, the adhesion is strong enough to prevent delamination, but not so strong that it produces a footed post-development profile or residual resist in the expose areas.

To reduce footing the TERA layer can be post-processed using a post-processing plasma to alter at least a portion of the TERA layer.

The above techniques can be applied not only to the TERA top layer, but also they could be applied for any part of the TERA layer, even if the TERA layer has only a single layer.

Figure 3:
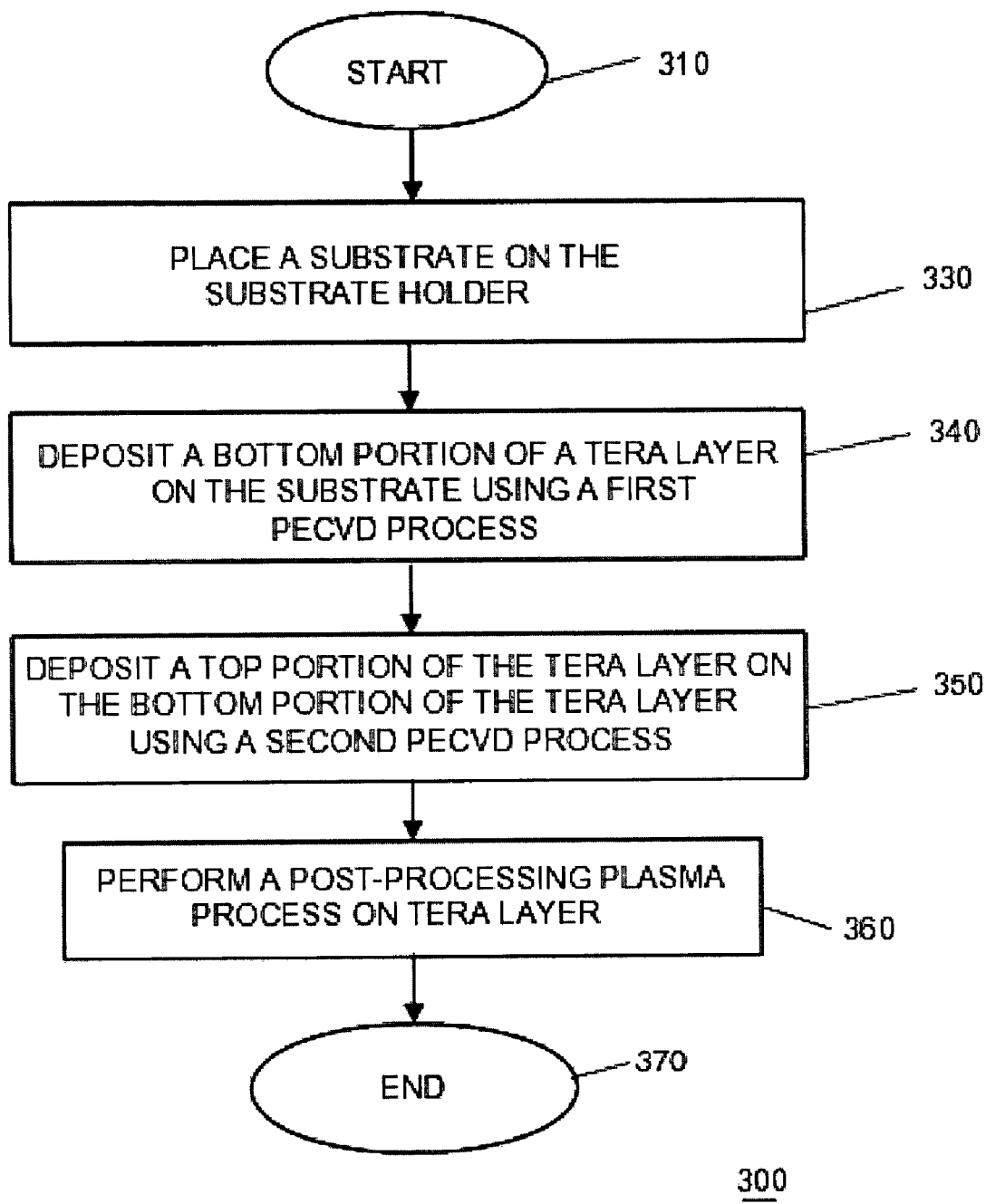
FIG. 3 shows a simplified flow diagram of a procedure for depositing a TERA layer comprising a first portion and a second portion on a substrate in accordance with an embodiment of the present invention.

FIG. 3 shows a simplified flow diagram of a procedure for depositing a TERA layer comprising a top portion and a bottom portion on a substrate in accordance with an embodiment of the present invention. For example, the bottom portion of a TERA layer can be deposited using a first process and the top portion of the TERA layer can be deposited using a different process. Procedure 300 starts at 310.

At 330, a substrate is placed on a substrate holder in a processing chamber. For example, the substrate holder can be used to establish a gap between an upper electrode surface and a surface of the substrate holder. The gap can range from approximately 1 mm to approximately 200 mm, or alternatively, the gap can range from approximately 2 mm to approximately 80 mm. The substrate holder can be translatable. Thus, in alternate embodiments, the gap size can be changed.

At 340, the bottom portion of the TERA layer can be deposited on the substrate. In an alternate embodiment, the bottom portion of the TERA layer is not required.

During the bottom portion deposition process, a TRF signal can be provided to the upper electrode using the first RF source. For example, the first RF source can operate in a frequency range from approximately 0.1 MHz. to approximately 200 MHz. Alternatively, the first RF source can operate in a frequency range from approximately 1 MHz. to approximately 100 MHz, or the first RF source can operate in a frequency range from approximately 2 MHz. to approximately 60 MHz. The first RF source can operate in a power range from approximately 10 watts to approximately 10000 watts, or alternatively, the first RF source can operate in a power range from approximately 10 watts to approximately 5000 watts.

Also, during the bottom portion deposition process, a BRF signal can be provided to the lower electrode in the substrate holder using the second RF source. For example, the second RF source can operate in a frequency range from approximately 0.1 MHz. to approximately 200 MHz. Alternatively, the second RF source can operate in a frequency range from approximately 0.2 MHz. to approximately 30 MHz, or the second RF source can operate in a frequency range from approximately 0.3 MHz. to approximately 15 MHz. The second RF source can operate in a power range from approximately 0.0 watts to approximately 1000 watts, or alternatively, the second RF source can operate in a power range from approximately 0.0 watts to approximately 500 watts. In an alternate embodiment, a BRF signal is not required.

In addition, a shower plate assembly can be provided in the processing chamber and can be coupled to the upper electrode. The shower plate assembly can comprise a center region, an edge region, and a sub region, and the shower plate assembly can be coupled to a gas supply system. A first process gas can be provided to the center region, a second process gas can be provided to the edge region and a third process gas can be provided to the sub region during the bottom portion deposition process.

Alternately, the center region and the edge region can be coupled together as a single primary region, and gas supply system can provide the first process gas and/or the second process gas to the primary region. In alternate embodiments, any of the regions can be coupled together and the gas supply system can provide one or more process gasses.

The first process gas and the second process gas can comprise at least one of a silicon-containing precursor and a carbon-containing precursor. An inert gas can also be included. For example, the flow rate for the silicon-containing precursor and the-carbon containing precursor can range from approximately 0.0 sccm to approximately 5000 sccm and the flow rate for the inert gas can range from approximately 0.0 sccm to approximately 10000 sccm. The silicon-containing precursor can comprise at least one of monosilane ($SiH_4$), tetraethylorthosilicate (TEOS), monomethylsilane (1MS), dimethylsilane (2MS), trimethylsilane (3MS), tetramethylsilane (4MS), octamethylcyclotetrasiloxane (OMCTS), and tetramethylcyclotetrasilane (TMCTS). The carbon-containing precursor can comprise at least one of $CH_4$, $C_2H_4$, $C_2H_2$, $C_6H_6$ and $C_6H_5OH$. The inert gas can be argon, helium, and/or nitrogen.

In addition, the third process gas can comprise at least one of an oxygen containing gas, a nitrogen containing gas, a carbon-containing gas, and an inert gas. For example, the oxygen containing gas can comprise at least one of $O_2$, CO, NO, $N_2O$, and $CO_2$; carbon-containing precursor can comprise at least one of $CH_4$, $C_2H_4$, $C_2H_2$, $C_6H_6$ and $C_6H_5OH$; the nitrogen containing gas can comprise at least one of $N_2$, and $NF_3$; and the inert gas can comprise at least one of Ar, and He. The flow rate for the third process gas can range from approximately 0.0 sccm to approximately 10000 sccm.

The flow rates for the first process gas and the second process gas can be independently established during the deposition of the bottom portion.

The bottom portion can comprise a material having a refractive index (n) ranging from approximately 1.5 to approximately 2.5 when measured at a wavelength of at least one of: 248 nm, 193 nm, and 157 nm, and an extinction coefficient (k) ranging from approximately 0.10 to approximately 0.9 when measured at a wavelength of at least one of: 248 nm, 193 nm, and 157 nm. The bottom portion can comprise a thickness ranging from approximately 30.0 nm to approximately 500.0 nm, and the deposition rate can range from approximately 100 A/min to approximately 10000 A/min. The bottom portion deposition time can vary from approximately 5 seconds to approximately 180 seconds.

In 350, a top portion can be deposited on the bottom portion. In an alternate embodiment, a bottom portion is not required and the top portion can be deposition by itself, for example, on a substrate.

During the deposition of the top portion of the TERA layer, a TRF signal can be provided to the upper electrode using the first RF source. For example, the first RF source can operate in a frequency range from approximately 0.1 MHz. to approximately 200 MHz. Alternatively, the first RF source can operate in a frequency range from approximately 1 MHz. to approximately 100 MHz, or the first RF source can operate in a frequency range from approximately 2 MHz. to approximately 60 MHz. The first RF source can operate in a power range from approximately 10 watts to approximately 10000 watts, or the first RF source can operate in a power range from approximately 10 watts to approximately 5000 watts.

In addition, a shower plate assembly can be provided in the processing chamber and can be coupled to the upper electrode. The shower plate assembly can comprise a center region and an edge region, and the shower plate assembly can be coupled to a gas supply system. A first process gas can be provided to the center region, a second process gas can be provided to the edge region, and a third process gas can be provided to the chamber through third gas region during the top portion deposition process.

Alternately, the center region and the edge region can be coupled together as a single primary region, and gas supply system can provide the first process gas and/or the second process gas to the primary region. In alternate embodiments, any of the regions can be coupled together and the gas supply system can provide one or more process gasses.

The first process gas and the second process gas can comprise at least one of a silicon-containing precursor and a carbon-containing precursor. For example, the flow rate for the silicon-containing precursor and the-carbon containing precursor can range from approximately 0.0 sccm to approximately 5000 sccm and the flow rate for the inert gas can range from approximately 0.0 sccm to approximately 10000 sccm. The silicon-containing precursor can comprise at least one of monosilane ($SiH_4$), tetraethylorthosilicate (TEOS), monomethylsilane (1MS), dimethylsilane (2MS), trimethylsilane (3MS), tetramethylsilane (4MS), octamethylcyclotetrasiloxane (OMCTS), tetramethylcyclotetrasilane (TMCTS), and dimethyldimethoxysilane (DMDMOS). The carbon-containing precursor can comprise at least one of $CH_4$, $C_2H_4$, $C_2H_2$, $C_6H_6$ and $C_6H_5OH$. The inert gas can comprise at least one of argon, helium, and nitrogen.

The third process gas can comprise at least one of an oxygen containing gas, a nitrogen containing gas, and an inert gas. The oxygen containing gas can comprise at least one of $O_2$, CO, NO, $N_2O$, and $CO_2$. The nitrogen containing gas can comprise at least one of $N_2$, and $NF_3$. The inert gas can comprise at least one of Ar and He. The flow rate for the third process gas can range from approximately 0.0 sccm to approximately 10000 sccm.

The flow rates for the first process gas, the second process gas, and the third process gas can be independently established during the deposition of the top portion.

The top portion can comprise a material having a refractive index (n) ranging from approximately 1.5 to approximately 2.5 when measured at a wavelength of at least one of: 248 nm, 193 nm, and 157 nm, and an extinction coefficient (k) ranging from approximately 0.10 to approximately 0.9 when measured at a wavelength of at least one of: 248 nm, 193 nm, and 157 nm.

The top portion can comprise a thickness ranging from approximately 5.0 nm to approximately 400.0 nm, and the deposition rate can range from approximately 50 A/min to approximately 5000 A/min. The top portion deposition time can vary from 5 seconds to approximately 180 seconds.

In an alternate embodiment, a BRF signal can be provided to the lower electrode using the second RF source during the top portion deposition process. For example, the second RF source can operate in a frequency range from approximately 0.1 MHz. to approximately 200 MHz. Alternatively, the second RF source can operate in a frequency range from approximately 0.2 MHz. to approximately 30 MHz, or the second RF source can operate in a frequency range from approximately 0.3 MHz. to approximately 15 MHz. The second RF source can operate in a power range from approximately 0.0 watts to approximately 1000 watts. Alternatively, the second RF source operates in a power range from approximately 0.0 watts to approximately 500 watts.

A pressure control system can be coupled to the chamber, and the chamber pressure can be controlled using the pressure control system. For example, the chamber pressure can range from approximately 0.1 mTorr to approximately 100 Torr.

A temperature control system can be coupled to the substrate holder, and the substrate temperature can be controlled using the temperature control system. For example, the substrate temperature can range from approximately 0° C. to approximately 500° C. The temperature control system can also be coupled to a chamber wall, and the temperature of the chamber wall can be controlled using the temperature control system. For example, the temperature of the chamber wall can range from approximately 0° C. to approximately 500° C. In addition, the temperature control system can be coupled to the shower plate assembly; and the temperature of the shower plate assembly can be controlled using the temperature control system. For example, the temperature of the shower plate assembly can range from approximately 0° C. to approximately 500° C.

In 360, a post-processing plasma process can be performed after TERA deposition to modify the surface of the TERA layer. By performing a post process plasma treatment using an oxygen-containing gas, the resist profile on the TERA surface can be improved, and the photoresist footing is reduced or eliminated. Alternatively, a hydrogen-containing gas can be used. Also, an inert gas can be included.

During the post-processing plasma process, a TRF signal can be provided to the upper electrode using the first RF source. For example, the first RF source can operate in a frequency range from approximately 0.1 MHz. to approximately 200 MHz. Alternatively, the first RF source can operate in a frequency range from approximately 1 MHz. to approximately 100 MHz, or the first RF source can operate in a frequency range from approximately 2 MHz. to approximately 60 MHz. The first RF source can operate in a power range from approximately 0.1 watts to approximately 10000 watts, or the first RF source can operate in a power range from approximately 1.0 watts to approximately 5000 watts.

In addition, a process gas can be provided into the processing chamber. For example, the flow rate for the process gas can range from approximately 0.0 sccm to approximately 10000 sccm. The process gas can comprise at least one of an oxygen containing gas and a hydrogen-containing gas. An inert gas can also be included. The oxygen containing-gas can comprises at least one of NO, $N_2O$, $O_2$, CO, and $CO_2$, the hydrogen-containing gas can comprise at least one of $H_2O$ and $H_2$, and the inert gas can comprise at least one of Ar, He, and $N_2$. The flow rates for the process gas and the inert gas can be independently established during the post-processing sequence.

During the post-processing plasma process, an ESC voltage is not required. Alternately, the ESC voltage can be lowered from a clamping potential to a lower potential. For example, the lower potential can be approximately zero volts.

The post-processing plasma process can comprise a de-chucking sequence. For example, during the top portion deposition process the lift pins can be activated. Alternately, de-chucking can occur before or after the post-processing plasma in applied. Alternatively, a de-chucking sequence is not required. The post-processing plasma process can extend from approximately 2 seconds to approximately 180 seconds.

During the plasma process the chamber pressure can remain constant. In addition, the chamber pressure can be changed during post-processing sequence. For example, the chamber pressure can vary from approximately 0.1 mTorr. to approximately 100 Torr.

Procedure 300 ends in 370.

Figure 4:
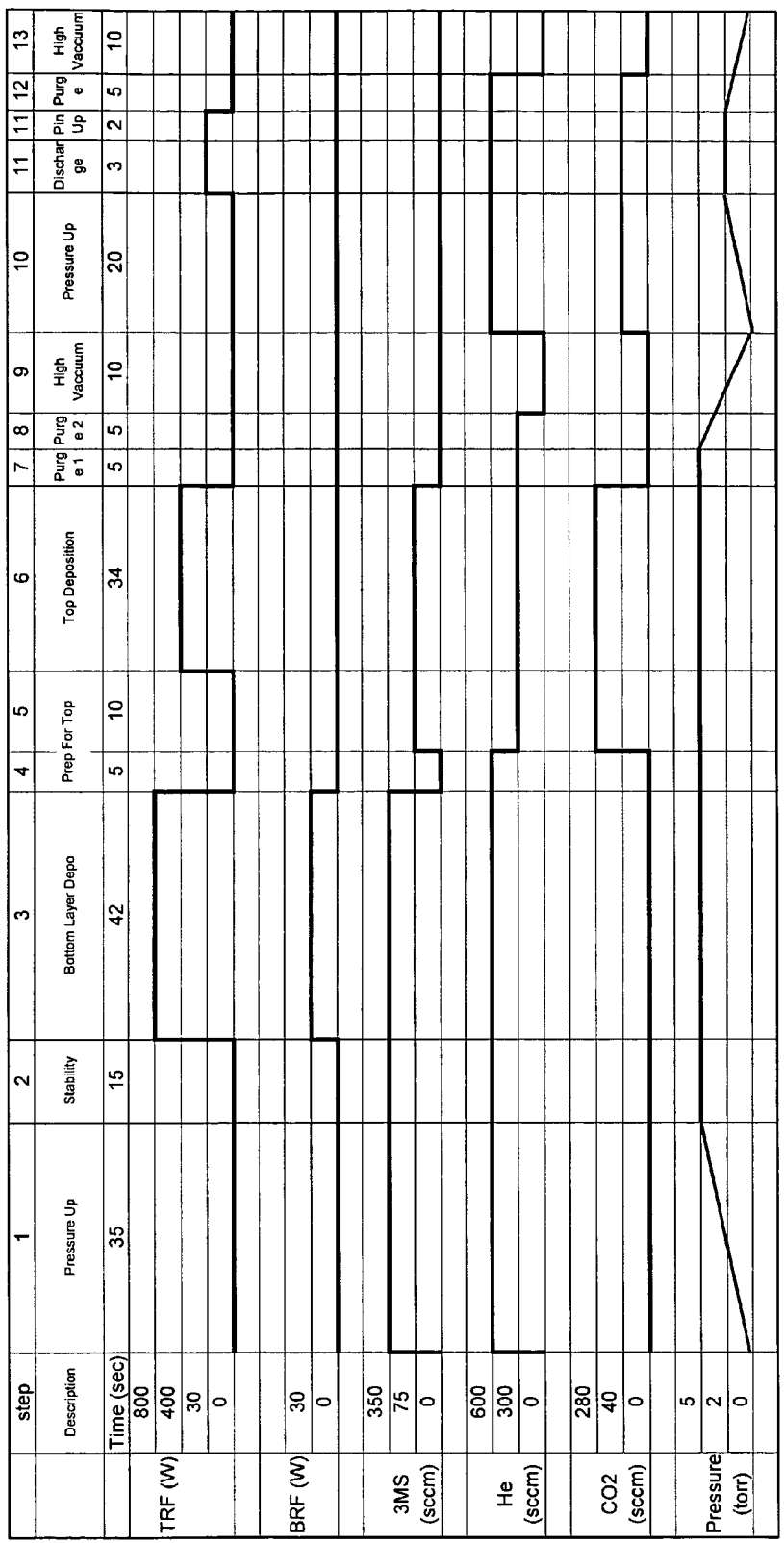
FIG. 4 shows an exemplary set of processes used in a procedure for depositing a TERA layer comprising a first portion and a second portion on a substrate in accordance with an embodiment of the present invention.

FIG. 4 shows an exemplary set of processes used in a procedure for depositing a TERA layer on a substrate in accordance with an embodiment of the present invention. In the first step, processing gases are introduced into the chamber, and an operating pressure is established. For example, the chamber pressure can be established at approximately 8 Torr, and the duration of the first step can be sixty seconds. The processing gases can include a silicon-containing precursor, a carbon-containing precursor and an inert gas. For example, 3MS and He can be employed at flow rates of approximately 100 sccm and approximately 600 sccm, respectively. In alternate embodiments, different pressures can be used, and different durations can be used.

In the second step, a stabilization process can be performed. For example, the flow rate of one or more of the processing gases can be changed, and a clamping voltage can be applied to the ESC. For example, the flow rate of He can be reduced to approximately 300 sccm.

In the third step, the bottom layer portion of the TERA layer can be deposited. A first RF source can provide an RF signal (TRF) to the upper electrode, and a second RF source can provide an RF signal (BRF) to the bottom electrode, which can be part of the substrate holder. For example, the TRF frequency can be in the range from approximately 0.1 MHz to approximately 200 MHz and the TRF power can be in the range from approximately 10 watts to approximately 10000 watts. Also, the BRF frequency can be in the range from approximately 0.1 MHz to approximately 200 MHz and the BRF power can be in the range from approximately 0.1 watts to approximately 1000 watts. In the illustrated embodiment (FIG. 4), the TRF frequency was approximately 13.56 MHz; the TRF power was approximately 700 watts; the BRF frequency was approximately 2 MHz; the BRF power was approximately 50 watts; and the ESC voltage was approximately −200 V. In alternate embodiments, different frequencies, power levels, and clamping voltages can be used.

In the fourth step, a preparation process can be performed. The TRF and BRF signal levels can be altered, the processing gasses can be changed, and flow rates can be modified. In the illustrated embodiment (FIG. 4), the TRF signal was turned off; the BRF signal was turned off; and the ESC voltage was unchanged. Also, the flow rate of the silicon-containing precursor was changed, and an oxygen-containing gas was supplied to the processing chamber. Alternatively, the plasma can be turned off and the pressure in the chamber can range from about 1 mTorr to about 20 Torr, with the process gas comprising at least one of a silicon-containing precursor, a carbon-containing precursor, an oxygen containing gas, and an inert gas. Or, the plasma can be maintained with an inert gas being provided to the chamber. Alternatively, the fourth step between the depositing of the bottom layer and the depositing of the cap layer can be eliminated so that the depositing of the cap layer occurs immediately after the depositing of the bottom layer. In the embodiment of FIG. 4, the flow rate of 3MS was reduced to approximately 75 sccm and $CO_2$ was introduced at a flow rate of approximately 50 sccm.

In the fifth step, the top layer portion of the TERA layer can be deposited. The first RF source can provide an RF signal (TRF) to the upper electrode, and a different combination of processing gases can be provided to the processing chamber. For example, the TRF frequency can be in the range from approximately 0.1 MHz to approximately 200 MHz and the TRF power can be in the range from approximately 10 watts to approximately 10000 watts. In addition, the combination of processing gases can include a silicon-containing precursor, a carbon-containing precursor, an oxygen-containing gas, and an inert gas. In the illustrated embodiment (FIG. 4), the TRF frequency was approximately 13.56 MHz; the TRF power was approximately 400 watts; the ESC voltage was approximately –200V; the silicon-containing precursor comprised 3MS at a flow rate of approximately 75 sccm, the oxygen-containing gas comprised $CO_2$ at a flow rate of approximately 50 sccm, and the inert gas comprised He at a flow rate of approximately 300 sccm. In alternate embodiments, different frequencies, power levels, and gases can be used.

In steps six and seven, purging processes can be performed. For example, the flow rate of one or more of the processing gases can be changed; the TRF signal can be altered; the ESC voltage can be changed; and the pressure can be modified. In the illustrated embodiment (FIG. 4), the TRF signal was turned off; the flow rate of the silicon-containing precursor, 3MS, was set to zero; the flow rate of the oxygen-containing gas, $CO_2$, was set to zero; the flow rate of the inert gas, He, was held constant; and the ESC voltage was set to zero.

In the eighth step, the chamber is evacuated and the pressure is lowered. For example, processing gas is not provided to the chamber during this step.

In the ninth step, the chamber pressure can be increased. For example, one or more processing gases can be supplied to the processing chamber and the chamber pressure can be maintained at a predetermined level. In the illustrated embodiment (FIG. 4), the RF signals are turned off; the flow rate of the silicon-containing precursor, 3MS, was set to zero; the flow rate of the oxygen-containing gas, $CO_2$, was set to approximately 36 sccm; the flow rate of the inert gas, He, was set to approximately 600 sccm; and the chamber pressure was maintained at approximately 2 Torr.

In the tenth step, a post-plasma treatment process can be performed. For example, a TRF signal can be used to establish plasma. In the illustrated embodiment (FIG. 4), the TRF signal was turned on; the flow rate of the silicon-containing precursor, 3MS, was set to zero; the flow rate of the oxygen-containing gas, $CO_2$, was set to approximately 36 sccm; the flow rate of the inert gas, He, was set to approximately 600 sccm; and the chamber pressure was maintained at approximately 2 Torr.

In the eleventh step, a pin up process can be performed. For example, the lift pins can be extended to lift the substrate off the substrate holder.

In the twelfth step, a purging process can be performed. For example, the TRF signal can be altered, and the chamber pressure can be changed. In the illustrated embodiment (FIG. 4), the TRF signal was turned off; the flow rate of the silicon-containing precursor, 3MS, was set to zero; the flow rate of the oxygen-containing gas, $CO_2$, was set to approximately 36 sccm; the flow rate of the inert gas, He, was set to approximately 600 sccm; and the chamber pressure was decreased from approximately 2 Torr.

In the thirteenth step, the chamber is evacuated and the pressure is lowered. For example, processing gas is not provided to the chamber during this step.

The above example illustrates that a TERA layer can be deposited by using a PECVD procedure to deposit a bottom layer and a top layer. In alternate procedures, a single TERA layer can be deposited.

In this embodiment, TERA bottom layer and top layer are deposited sequentially in one chamber. During the period between bottom and top layer deposition, the plasma is turned off. In an alternate embodiment, TERA bottom layer and top layer can be deposited sequentially in the same chamber without turning off the plasma. In an alternate embodiment, TERA bottom layer and top layer can be deposited in separate chambers.

In this embodiment, the chamber is kept at a specific pressure between bottom layer and top layer deposition. In an alternate embodiment, the chamber may be evacuated between the deposition of the layers.

The above example illustrates that the top portion of a TERA layer can be deposited and a photoresist-compatible surface can be formed on the top of a TERA layer to prevent the formation of a photoresist foot.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method for depositing a material on a substrate, the method comprising:

placing a substrate on a substrate holder in a chamber having a plasma source, wherein the plasma source comprises an RF source coupled to an upper electrode and the substrate holder comprises a bottom electrode coupled to a second RF source;

introducing first processing gases into the chamber using a shower plate assembly coupled to the chamber, wherein the first processing gases include a trimethylsilane (3MS) precursor and Helium (He) gas;

establishing an operating pressure in the chamber, the operating pressure being established at approximately 5 Torr, depositing a bottom layer portion of a Tunable Etch Resistant ARC (TERA) layer on the substrate, wherein the first processing gases are provided to the chamber, and the RF source is operated at a power level of approximately 800 watts, the second RF source is operated at a power level of approximately 30 watts, the shower plate assembly having a center region, an edge region, and a sub region configured to establish a first flow rate for the 3MS precursor between approximately 0 sccm and approximately 350 sccm and to establish another first flow rate for the He gas between approximately 0 sccm and approximately 600 sccm when the bottom layer portion is deposited;

introducing second processing gasses into the chamber using the shower plate assembly, the second processing gases including the 3MS precursor, $CO_2$ gas, and the He gas;

depositing a top layer portion of the TERA layer on the substrate, wherein the second processing gases are provided to the chamber, and the RF source is operated at a power level of approximately 400 watts, the center region, the edge region, and the sub region being further configured to establish a second flow rate for the 3MS precursor between approximately 0 sccm and approximately 75 sccm to establish a flow rate for the $CO_2$ gas between approximately 0 sccm and approximately 50 sccm and to establish a second flow rate for the He gas between approximately 0 sccm and approximately 600 sccm while depositing the top layer portion;

performing at least one purging process, wherein the RF source is operated at approximately zero watts, an ESC voltage is approximately 0 volts, and the center region, the edge region, and the sub region are further configured to establish a third flow rate for the He gas between approximately 0 sccm and approximately 300 sccm;

performing an evacuation process, wherein the RF source is operated at approximately zero watts, and the operating pressure is established below approximately 2 Torr;

introducing third processing gases into the chamber using the shower head assembly, the third processing gases including $CO_2$ gas, and He gas;

establishing a post-processing pressure in the chamber, the post-processing pressure being established at approximately 2 Torr, establishing a post-processing plasma in the chamber, wherein the third processing gases are provided to the chamber the RF source is operated at a power level of approximately 30 watts, and the center region, the edge region, and the sub region are further configured to establish a fourth flow rate for the $CO_2$ gas between approximately 0 sccm and approximately 40 sccm and to establish another fourth flow rate for the He gas between approximately 0 sccm and approximately 600 sccm during the post-processing plasma;

modifying a top surface of the top layer portion of the deposited TERA layer by exposing the top layer portion of the deposited TERA layer to the post-processing plasma during the establishing step;

performing a pin up process while the post-processing plasma is established, wherein the substrate is lifted off the substrate holder using one or more lift pins; and further modifying the top surface of the top layer portion of the deposited TERA layer by exposing the top surface of the top layer portion of the deposited TERA layer to the post-processing plasma during the pin up process step, wherein the modified top surface is created on the top surface of the top layer portion of the deposited TERA layer to prevent a photoresist problem during a subsequent lithographic operation.

2. The method as claimed in claim 1, wherein the first processing gases, the second processing gases, and/or the third processing gases comprise a hydrogen-containing gas having an additional flow rate ranging from approximately 0.0 sccm to approximately 10000 sccm, wherein the hydrogen-containing gas comprises at least one of $H_2O$ and $H_2$.

3. The method as claimed in claim 1, wherein the first processing gases, the second processing gases, and/or the third processing gases comprise an inert gas having an additional flow rate ranging from approximately 0.0 sccm to approximately 10000 sccm, wherein the inert gas comprises at least one of Ar, and $N_2$.

4. The method as claimed in claim 1, wherein the
RF source operates in a frequency range from approximately 0.1 MHz. to approximately 200 MHz
and the second RF source operates in a frequency range from approximately 0.1 MHz. to approximately 200 MHz.

5. The method as claimed in claim 1, wherein the establishing the post-processing plasma step has a lifetime time that varies from approximately 2 seconds to approximately 180 seconds.

6. The method as claimed in claim 1, wherein
the bottom layer portion comprises a material having a refractive index (n) ranging from approximately 1.5 to approximately 2.5 when measured at a wavelength of at least one of: 248 nm, 193 nm, and 157 nm, and an extinction coefficient (k) ranging from approximately 0.10 to approximately 0.9 when measured at a wavelength of at least one of: 248 nm, 193 nm, and 157 nm.

7. The method as claimed in claim 1, wherein the depositing of the bottom layer portion of the TERA layer occurs at a rate from approximately 100 A/mm to approximately 10000 A/mm.

8. The method as claimed in claim 1, wherein a deposition time for the bottom layer portion of the TERA layer ranges from approximately 5 seconds to approximately 180 seconds.

9. The method as claimed in claim 1, wherein the first processing gases, the second processing gases, and/or the third processing gases
comprises at least one of a silicon-containing precursor and a carbon-containing precursor.

10. The method as claimed in claim 9, wherein the flow rate of the silicon-containing precursor and/or the carbon-containing precursor ranges from approximately 0.0 sccm to approximately 5000 sccm.

11. The method as claimed in claim 1, wherein the first processing gases, the second processing gases, and/or the third processing gases further comprises at least one of monosilane ($SiH_4$), tetraethylorthosilicate (TEOS), monomethylsilane (1MS), dimethylsilane (2MS), tetramethylsilane (4MS), octamethylcyclotetrasiloxane (OMCTS), and tetramethylcyclotetrasilane (TMCTS).

12. The method as claimed in claim 1, wherein the first processing gases, the second processing gases, and/or the third processing gases further comprises at least one of $CH_4$, $C_2H_4$, $C_2H_2$, $C_6H_6$ and $C_6H_5OH$.

13. The method as claimed in claim 1, wherein
the top layer portion comprises material having a refractive index (n) ranging from approximately 1.5 to approximately 2.5 when measured at a wavelength of at least one of: 248 nm, 193 nm, and 157 nm, and an extinction coefficient (k) ranging from approximately 0.10 to approximately 0.9 when measured at a wavelength of at least one of: 248 nm, 193 nm, and 157 nm.

14. The method as claimed in claim 1, wherein the depositing of the top layer portion of the TERA layer occurs at a rate from approximately 10 A/min to approximately 5000 A/min.

15. The method as claimed in claim 1, wherein a deposition time for the bottom layer portion of the TERA layer ranges from approximately 5 seconds to approximately 180 seconds.

16. The method as claimed in claim 1, wherein the first processing gases, the second processing gases, and/or the third processing gases further comprises at least one of tetramethylcyclotetrasilane (TMCTS) tetraethylorthosilicate (TEOS) precursor, a dimethyldimethoxysilane (DMDMOS) precursor, and an octamethylcyclotetrasiloxane (OMCTS) precursor.

17. The method as claimed in claim 1, wherein the substrate temperature ranges from approximately 0° C. to approximately 500° C. during the depositing of the bottom layer portion of the TERA layer.

18. The method as claimed in claim 1, wherein a temperature of the shower plate assembly ranges from approximately 0° C. to approximately 500° C.

* * * * *

UNITED STATES PATENT AND TRADEMARK OFFICE
CERTIFICATE OF CORRECTION

PATENT NO. : 7,611,758 B2 Page 1 of 1
APPLICATION NO. : 10/702049
DATED : November 3, 2009
INVENTOR(S) : Fukiage et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1290 days.

Signed and Sealed this

Fourteenth Day of December, 2010

David J. Kappos
*Director of the United States Patent and Trademark Office*